(12) United States Patent
Rossmann et al.

(10) Patent No.: US 9,379,661 B2
(45) Date of Patent: Jun. 28, 2016

(54) METHOD AND DEVICE FOR FULLY AUTOMATICALLY SELECTING AND PACKING PHOTOVOLTAIC MODULES

(71) Applicant: Grenzebach Maschinenbau GmbH, Asbach-Baeumenheim (DE)

(72) Inventors: Thomas Rossmann, Merlingen (DE); Egbert Wenninger, Rain (DE)

(73) Assignee: Grenzebach Maschinenbau GmbH, Asbach-Baeumenheim (DE)

( * ) Notice: Subject to any disclaimer, the term of this patent is extended or adjusted under 35 U.S.C. 154(b) by 0 days.

(21) Appl. No.: 14/261,474

(22) Filed: Apr. 25, 2014

(65) Prior Publication Data

US 2014/0230214 A1 Aug. 21, 2014

Related U.S. Application Data

(63) Continuation of application No. 13/131,230, filed as application No. PCT/DE2009/001679 on Nov. 26, 2009, now abandoned.

(30) Foreign Application Priority Data

Dec. 1, 2008 (DE) .......................... 10 2008 059 793

(51) Int. Cl.
*H02S 50/10* (2014.01)
*H02S 99/00* (2014.01)
(Continued)

(52) U.S. Cl.
CPC ................. *H02S 50/00* (2013.01); *B65B 23/20* (2013.01); *H01L 21/67236* (2013.01);
(Continued)

(58) Field of Classification Search
CPC .................. Y10T 29/49764; Y10T 29/49769; Y10T 29/49771; Y10T 29/49774; Y10T 29/49004; Y10T 29/49355; Y10T 29/49826; Y10T 29/49829; Y10T 29/5137; Y10T 29/53022; Y10T 29/53187; Y10T 29/53478; Y10T 29/53365; Y10T 29/534; B23P 11/00; B23P 15/26; B23P 19/007; B23P 21/004; B23P 31/18; B65B 23/20; B65G 57/005; B65G 61/00; H01L 21/67271; H01L 21/67236; H01L 21/67294; H01L 21/67754; H02S 50/10; H02S 99/00
See application file for complete search history.

(56) References Cited

U.S. PATENT DOCUMENTS 2,394,410 A * 2/1946 Tascher .......................... 271/119
2,963,836 A 12/1960 Bruce
(Continued)

FOREIGN PATENT DOCUMENTS

DE 2 353 031 5/1974
DE 25 23 301 12/1976
(Continued)

OTHER PUBLICATIONS

German Office Action with English Translation, Dated Aug. 31, 2009.
(Continued)

*Primary Examiner* — Ryan J Walters
*Assistant Examiner* — Matthew P Travers
(74) *Attorney, Agent, or Firm* — Brinks Gilson & Lione

(57) ABSTRACT

The disclosure relates to a method and to a device for fully automatically selecting and packing photovoltaic solar modules, for example, produced in mass production. The device may include the following characteristics: a production line, b) a quality checking device having devices for mechanical final testing and electrical final testing, c) an assembly device for module carriers, d) a device for distributing and stacking the solar modules in the horizontal and vertical direction according to particular selection criteria at acceptance locations corresponding to said selection criteria, e) devices for placing strips as spacers between stacked modules, wherein different types of strips can be taken from a magazine, f) devices for collating packages of a plurality of solar modules at each acceptance location, wherein aid devices each comprise a film wrapper, a protective cap applicator, and a strapping device.

18 Claims, 3 Drawing Sheets

(51) Int. Cl.
*H01L 33/00* (2010.01)
*H01L 21/67* (2006.01)
*G01R 31/40* (2014.01)
*B65B 23/20* (2006.01)
*H01L 31/18* (2006.01)
*B65B 11/00* (2006.01)
*B65B 13/00* (2006.01)
*B65B 35/50* (2006.01)
*B65B 55/00* (2006.01)
*H01L 21/677* (2006.01)

(52) U.S. Cl.
CPC ......... *H01L 21/67271* (2013.01); *H01L 31/18* (2013.01); *H02S 99/00* (2013.01); *B65B 11/00* (2013.01); *B65B 13/00* (2013.01); *B65B 35/50* (2013.01); *B65B 55/00* (2013.01); *H01L 21/67294* (2013.01); *H01L 21/67754* (2013.01); *Y10T 29/49355* (2015.01); *Y10T 29/49764* (2015.01); *Y10T 29/5137* (2015.01); *Y10T 29/53022* (2015.01); *Y10T 29/53187* (2015.01)

(56) References Cited

U.S. PATENT DOCUMENTS

| | | | |
|---|---|---|---|
| 3,630,627 A * | 12/1971 | Low et al. | 356/222 |
| 4,090,618 A | 5/1978 | Lehmann | |
| 4,986,726 A | 1/1991 | Benuzzi et al. | |
| 5,085,030 A * | 2/1992 | Segawa et al. | 53/399 |
| 5,205,026 A | 4/1993 | Sticht | |
| 5,414,978 A | 5/1995 | Limousin | |
| 6,162,986 A * | 12/2000 | Shiotsuka et al. | 136/244 |
| 6,265,242 B1 | 7/2001 | Komori et al. | |
| 6,302,272 B1 * | 10/2001 | Hata et al. | 206/451 |
| 6,678,948 B1 * | 1/2004 | Benzler et al. | 29/840 |
| 7,671,620 B2 | 3/2010 | Manz | |
| 2002/0144654 A1 | 10/2002 | Elger | |
| 2005/0011779 A1 | 1/2005 | Avalos-Guzman et al. | |
| 2006/0292846 A1 | 12/2006 | Pinto et al. | |
| 2008/0028860 A1 * | 2/2008 | Refko et al. | 73/597 |
| 2008/0193272 A1 * | 8/2008 | Beller | 414/797 |
| 2009/0077805 A1 * | 3/2009 | Bachrach et al. | 29/890.033 |
| 2009/0265033 A1 * | 10/2009 | Baccini | 700/223 |

FOREIGN PATENT DOCUMENTS

| | | |
|---|---|---|
| DE | 37 36 560 A1 | 5/1988 |
| DE | 40 10 024 A1 | 10/1990 |
| DE | 31 05 352 C2 | 4/1992 |
| DE | 93 12 710.3 | 12/1993 |
| DE | 199 52 195 A1 | 5/2001 |
| DE | 10 2005 046 216 A1 | 3/2007 |
| EP | 0 111 394 | 6/1984 |
| EP | 1 006 061 A2 | 6/2000 |
| EP | 1 647 827 A1 | 4/2006 |
| JP | 2001091567 A | 4/2001 |
| JP | 2002166234 A | 6/2002 |
| WO | WO 2009/053783 A1 | 4/2009 |

OTHER PUBLICATIONS

International Search Report for International Application No. PCT/DE2009/001679, Dated May 7, 2010.

* cited by examiner

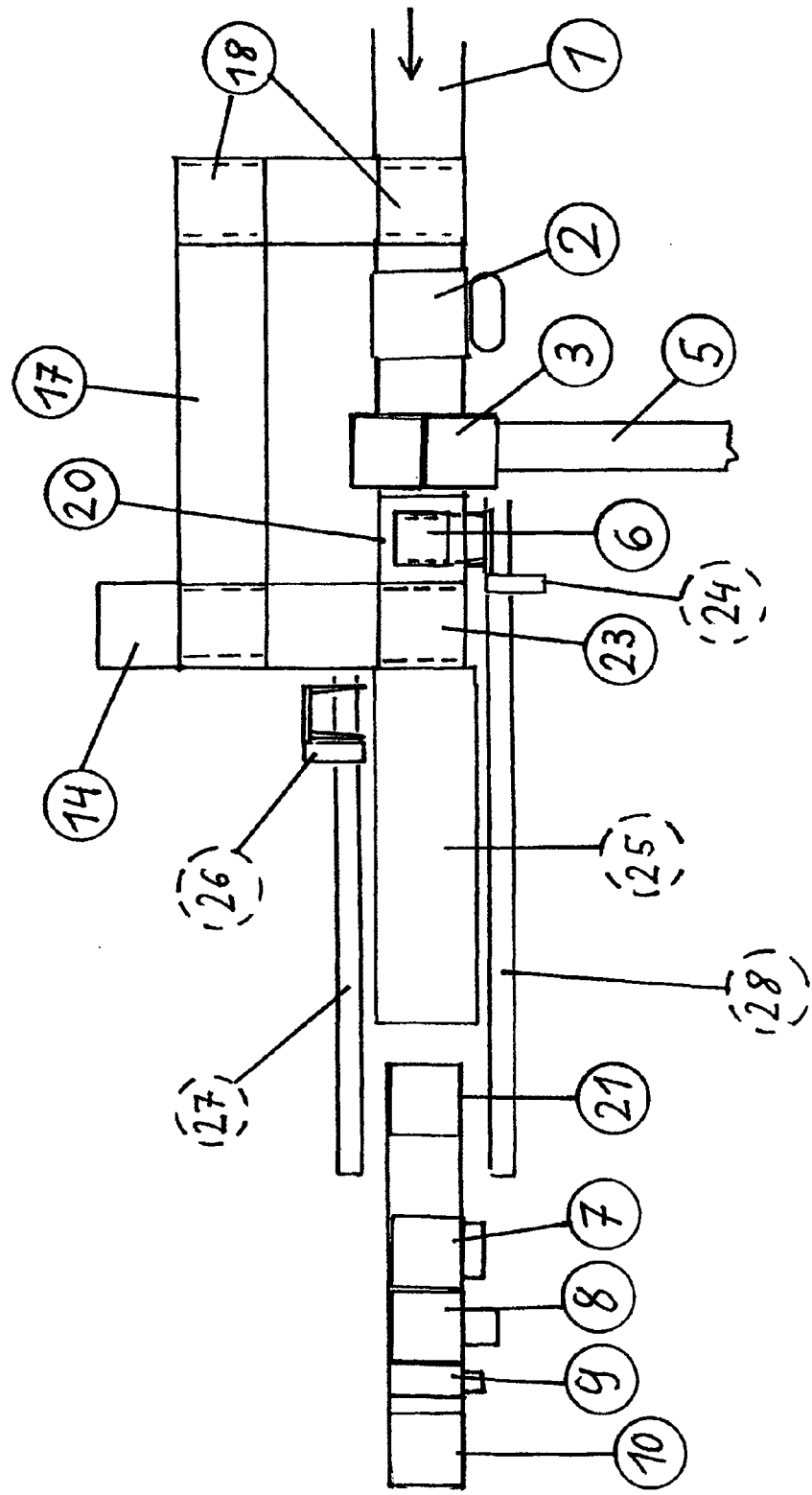

METHOD AND DEVICE FOR FULLY AUTOMATICALLY SELECTING AND PACKING PHOTOVOLTAIC MODULES

CROSS REFERENCE TO RELATED APPLICATIONS

This application is a continuation of U.S. Ser. No. 13/131,230, filed May 25, 2011, entitled "Method And Device For Fully Automatically Selecting And Packing Photovoltaic Modules," which claims priority to international application number PCT/DE2009/001679 filed Nov. 26, 2009 (WO 2010/063263 A1), which also claims priority to German application number 10 2008 059 793.7 filed Dec. 1, 2008, all of which are hereby incorporated by reference in their entirety.

BACKGROUND

Summary

The invention relates to the practice of fully automatically selecting and packing photovoltaic modules or solar modules which are produced in large batches.

Modern glass facades are often not just a functional element of a structural body, but are increasingly also being used for solar electricity generation. Tailor-made solar modules allow accurately fitting integration in construction grids and profiles. Semitransparent solar cells, or else opaque solar cells with transparent areas, make photovoltaic glazing systems appear as if light is flooding through them. In this case, the solar cells frequently provide the desired effect of solar and glare protection.

The production of such photovoltaic installations requires working conditions such as those which are normally used, in particular, for the production of semiconductors and integrated electronic circuits. These so-called clean room conditions also additionally make it necessary to handle large-area, impact-sensitive glass panes when producing photovoltaic installations.

Considered from the outside, a photovoltaic module is the connection of a glass substrate plate, a photovoltaic element and a glass pane as covering glass by means of a film, which adhesively bonds these glass panes under the action of heat, or an adhesive.

The production of photovoltaic installations is still relatively expensive. There is therefore an aim to produce photovoltaic modules in large batches, and thus to reduce the costs.

When producing such photovoltaic modules in large quantities, products of different quality levels cannot be prevented from being produced. Classification according to particular quality criteria is carried out in this case within the range of particular technical properties such as the electrical voltage achieved with a particular illuminance.

For example, classification into four different quality levels may make it necessary to select finished photovoltaic modules with the corresponding quality levels.

If, when photovoltaic modules are being simultaneously produced on a plurality of production lines, products which can be assigned to different quality levels are also produced on each production line, the products belonging to the same quality level must therefore be detected anyway and this information must be centrally stored.

DE 31 05 352 C2 discloses an arrangement for displaying the operating state of solar cells. These are solar cells which are connected together in modules, at least one display element being parallel to at least one module. The problem on which this arrangement is based is that of avoiding the need for any considerable wiring expenditure and being able to monitor the arrangement in a simple manner. In order to solve this problem, DE 31 05 352 C2 proposes that the display element is integrated in the module.

An indication of the practice of selecting and packing photovoltaic installations cannot be gathered from this document.

DE 93 12 710 U1 discloses a modular diagnostic system for detecting and locating faults in photovoltaic installations. Said document describes a diagnostic system for detecting and locating faults in photovoltaic installations consisting of at least two decentralized components which are assigned to the modules or groups of modules or parts of modules. Such a diagnostic unit has at least one central evaluation unit which determines and displays faults and failures in photovoltaic installations on the basis of the information transmitted by or received from the central components, the information being transmitted via the power lines.

In the case of such a diagnostic system, the process of detecting and locating faults in photovoltaic installations is intended to be considerably simplified without the need for additional installation expenditure when wiring the installation.

This problem is solved by the fact that the decentralized components consist of frequency-dependent impedances, which are connected to the external connections of the modules and the frequency response of which is characteristic of the respective module and its operating state, and the central evaluation unit measures the impedance of the power lines over the frequency range of interest in order to obtain information relating to the state of the installation in this manner.

Another solution according to DE 93 12 710 U1 is that the decentralized components consist of active circuits which impress an AC voltage or an alternating current on the connections of the module or superimpose said voltage or current on the DC voltage or direct current of the module, the frequency and frequency spectrum of the alternating variable being characteristic of the respective module and its operating state and the central evaluation unit measuring the frequency spectrum of the voltage and/or current on the power lines and determining the operating state of the installation in this manner.

An indication of the practice of selecting and packing photovoltaic installations cannot be gathered from this document either.

DE 37 36 560 A1 describes a device for producing gratings. In this case, gratings of a wide variety of forms are produced in an automated manner using a transfer system for workpiece carriers.

DE 23 53 031 A1 deals with a device for forwarding objects at an angle, in particular for processing lines for plate elements. Said device substantially consists of conveying devices and conveyor belt devices which are of a simple construction and can be inexpensively produced.

DE 40 10 024 relates to a production installation with parallel and secondary paths of conveyance for assembling and/or processing components consisting of a plurality of individual parts, in which the individual parts and/or components are arranged on pallet inserts. For the purpose of cost-effective production, it is substantially proposed here to assign a secondary path of conveyance, which runs in a parallel manner, to a parallel path of conveyance, this secondary path of conveyance being connected to the parallel path of conveyance and/or the main path of conveyance via node stations.

The three documents mentioned last deal with simple methods of transporting or producing objects which are likewise simple.

U.S. Pat. No. 4,986,726 A describes a device for automatically stacking and classifying packages consisting of plates of different sizes. A system of horizontal and vertical transport means is used for this purpose. The special requirements when handling photovoltaic modules are not dealt with in this document.

DE 25 23 301 A1 relates to a device for depositing stacking strips between layers of boards, which are on top of one another, in order to form a stack of boards. This concerns an insignificant feature of the storage of photovoltaic modules.

U.S. Pat. No. 2,963,836 A describes a device for automatically handling and packing rigid and semi-rigid plates. This is substantially a horizontal and vertical movement of plates in a limited table-like area.

The device and the method according to this application may address the problem of inexpensively ensuring that photovoltaic modules are selected and packed in an automatically controlled and reliable manner and with fast cycle times.

The device according to the invention is described in more detail below. In detail:

Further aspects of this application will become readily apparent to persons skilled in the art after a review of the following description, with reference to the drawings and claims that are appended to and form a part of this specification.

BRIEF DESCRIPTION OF THE DRAWINGS

FIG. 3 shows an alternative solution of the device according to the invention.

DETAILED DESCRIPTION

Figure 1:
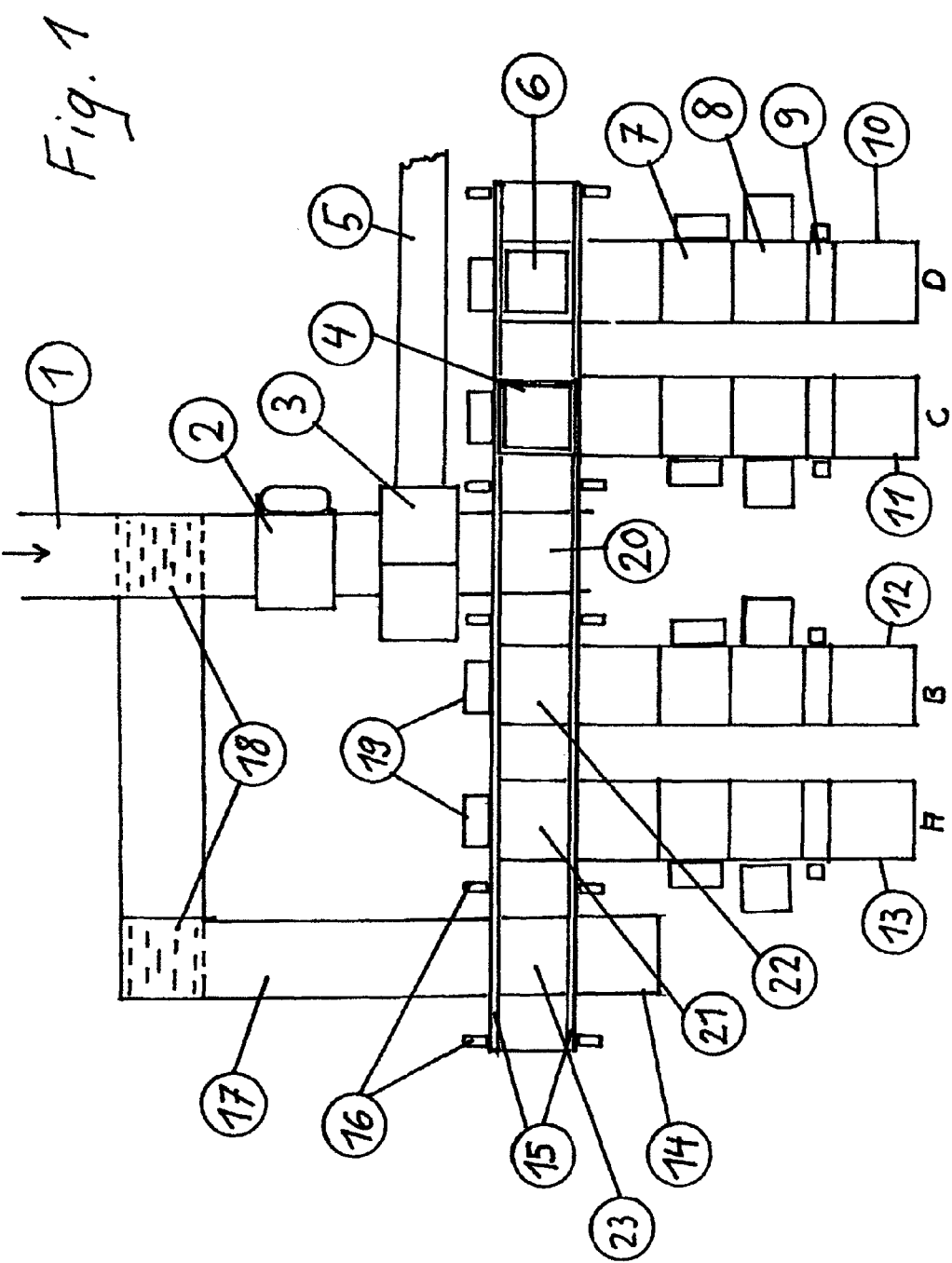
FIG. 1 shows a structural overview of the device according to the invention.

The upper part of FIG. 1 illustrates a production line 1 discharging into the removal area. At the end of the production line 1, each photovoltaic module passes through the quality testing device 2. This is necessary since the process of producing photovoltaic modules does not ensure that every module has the same performance data. In fact, the performance parameters of photovoltaic modules are scattered to such an extent that it has proved to be necessary to divide the production yield into at least four different performance classes.

The allocation to these classes is determined in the quality testing device 2.

The following investigations can be carried out in this testing device 2:
1. Measurement of the lamination
2. Integrity of the panes
3. Testing of the contacts
4. Electrical measurement of the efficiency
5. Linking to existing production data The measurement of the lamination and the integrity of the panes can be monitored by means of cameras. These investigations are already carried out once during production and can be repeated according to the desired safety requirement at this point. In addition, vibration tests can be carried out at this point, and more detailed investigations of the integrity can be carried out using ultrasound. The electrical contacts are tested and the efficiency is measured using electrical test circuits. In order to determine cold soldering points, the effects of cold (cooling spray) at certain points can be studied at electrical transition points. A measurement of resistive and/or inductive and/or capacitive impedances which is carried out shortly afterward reliably provides information on soldering points which have not been produced properly. This makes it possible to determine weak points in the electrical wiring at an early stage, which weak points often subsequently result in sudden failures only after a relatively long time in the changing weather cycles. The photovoltaic module which has been respectively tested can be electronically linked to the data known from production via barcodes or RFID (=radio frequency identification) transponders.

In the next station 3, the assembly device for module carriers, a particular module carrier is automatically fastened to the respective module. The module carrier establishes the connection between the glass panes of a module and the assembly options existing at the respective place of use. It is known that a multiplicity of fastening options are desired by the respective user. In accordance with these different fastening options, the corresponding different types of module carriers are provided on the supply line 5 for module carriers.

Since different requirements with regard to the desired performance class are additionally imposed by the users on these different types of module carriers to be fitted, the module carriers cannot be assembled until after the respective performance class has been determined.

A photovoltaic module which has been classified in this manner according to its specific performance class and its specific type of fastening via a barcode or a transponder then reaches the receiving station 20 of the production line.

From this receiving station 20, the finished photovoltaic modules are moved to the removal stations D, C, B, A, which are denoted 10, 11, 12, 13 in FIG. 1, according to their performance class and their respective module carrier. The removal station 14 is used to store reject modules. These transport operations are carried out by a lifting sucker device which can move on a mount 4 via the running rails 15. The running rails 15 are mounted, over their entire length, on running rail supports 16. The length of the running rails 15 can be changed. The height of the running rail supports 16 can be changed in a controllable manner using actuators. This makes it possible to adapt the device according to the invention to different production conditions during operation.

As an example of such a transport operation, a photovoltaic solar module 6 is depicted in FIG. 1 at the start of the removal station 10 at the corresponding stacking station which is not described in any more detail. The stacking stations in the removal stations A and B are denoted 21 and 22 in FIG. 1.

A strip laying means 19 for spacer strips is assigned to each removal station 10, 11, 12, 13. This strip laying means ensures that at least two strips are laid between modules which have been placed on top of one another, which strips have such a thickness that the components projecting from the glass surface of a module, such as terminal boxes or module carriers, cannot damage the glass surface of the adjacent module. For reasons of clarity, the respective strip laying means 19 are depicted only at the removal stations A and B in FIG. 1.

Each removal station 10, 11, 12, 13 is also respectively assigned a film winder 7, a protective cap applicator 8 and a strapping device 9.

A film winder 7 wraps the solar modules 6, which are intended for dispatch and lie on top of one another, in a protective packaging film which simultaneously holds the entire package of the solar modules 6 together. Protective cap applicators 8 then place protective caps on two opposite sides of a package of solar modules 6 which lie on top of one another. The strapping devices 9 upstream of the individual removal stations 10, 11, 12, 13 preferably act in the region of the protective caps and provide the respective package of solar modules 6 with the required cohesive strength and make the package ready for dispatch.

In addition, it is possible to attach a "docket", which identifies the respective package of solar modules 6 which are ready for dispatch, in printed and/or electronic form.

In order to assist with the control decisions involved in the individual transport operations, corresponding sensors and means for evaluating the output signals from the relevant sensors are located at relevant points of the device according to the invention. These sensors are usually optical sensors of any type and/or proximity sensors which are chosen by a person skilled in the art according to the local conditions and requirements.

If, in individual cases, it appears to be necessary for a solar module 6 to pass through the quality testing device 2 again, it is possible to supply said module to the production line 1 again via the return line 17 depicted in FIG. 1. This makes it possible, in individual cases, if the user so desires, to manually repair a solar module 6 whose testing led to a borderline result. For this purpose, two angle conveyors 18 which allow such return are illustrated in FIG. 1. The corresponding transfer station is denoted 23 in FIG. 1. Since the entire installation operates in a fully automatic manner, pauses in the production process can be used to retest particular solar modules 6.

Figure 2:
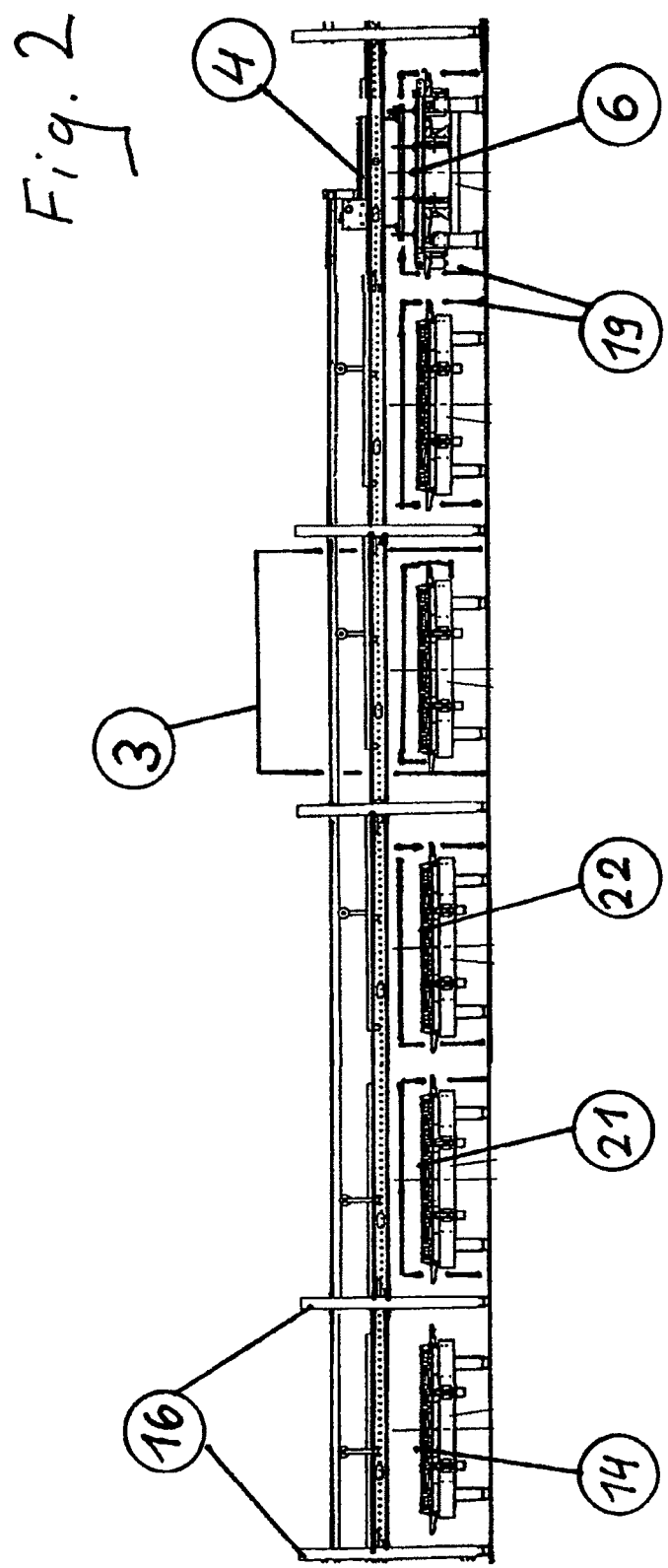
FIG. 2 shows a cross section of the running rail 15.

FIG. 2 illustrates a cross section of the more detailed region of the area surrounding the running rail 15. In this case, on the left-hand side, two running rail supports 16 can be seen to the left and right of the removal station 14 for reject modules. To the right thereof, the stacking station A with the reference symbol 21 and then the stacking station B with the reference symbol 22 are shown in cross section. Following on, the assembly device 3 for module carriers is illustrated. This is followed by the removal station C and the removal station A, neither of which is denoted, a strip laying means 19 being depicted for each of the two removal stations. A solar module 6 can be seen at the removal station D and the lifting sucker mount 4 can be seen, by way of example, behind said solar module.

An alternative solution to the problem on which the invention is based is illustrated in FIG. 3.

This figure is based on the same structure of operations for selecting and packing solar modules 6 as that disclosed in FIG. 1, only the removal station D being depicted for the sake of better illustration.

The fundamental difference from the structure of the outlet stations shown in FIG. 1 is that the lifting sucker mount 4 with its running rails 15 has been replaced with a store 25 with corresponding devices for loading and unloading this store 25.

This means that the solar modules 6 classified in the quality and testing device 2 are not directly assigned to the individual removal stations but rather are first stored in a store 25 which can also be referred to as an intermediate store. In this case, the store 25 can store the solar modules 6 substantially in a horizontal manner, that is to say may be in the form of a vertically oriented vertical store, or may have a combination of a horizontal and a vertical method of storage. In this case, the design depends on the respective spatial conditions and requirements of the operator of the entire installation. The store 25 is preferably open to both sides and can therefore be loaded with solar modules 6 and unloaded from the front and/or from the rear. In this case, the devices 24 and 26 are provided for the possibilities of loading and unloading the store 25. The associated guide tracks are denoted 28 and 27. The capacity of the store 25 is unlimited in theory. The number of removal stations assumed to be four in the device in FIG. 1 can naturally be considerably higher both in the solution according to FIG. 1 and in the solution according to FIG. 3. In this case, the number of removal stations depends mainly on the number of desired performance classes. Since the data which are relevant to delivery for each solar module 6 can be electronically assigned to the latter, the devices 25, 28 can be used to supply the provided unloading stations with the desired number of solar modules 6. Therefore, it is possible to also change the size of an order at short notice. This applies to the solution according to FIG. 1 and FIG. 3.

The complex control of the movement sequences described requires a special control program.

As a person skilled in the art will readily appreciate, the above description is meant as an illustration of implementation of the principles this application. This description is not intended to limit the scope or application of this invention in that the invention is susceptible to modification, variation and change, without departing from the spirit of this invention, as defined in the following claims.

LIST OF REFERENCE SYMBOLS (1) Production line
(2) Quality testing device
(3) Assembly device for module carriers
(4) Lifting sucker mount
(5) Supply line for module carriers
(6) Solar module
(7) Film winder (packaging)
(8) Protective cap applicator
(9) Strapping device
(10) Removal station D
(11) Removal station C
(12) Removal station B
(13) Removal station A
(14) Removal station for reject modules
(15) Running rails for lifting sucker mount 4
(16) Running rail supports
(17) Return line (test repetition)
(18) Angle conveyor
(19) Strip laying means (spacer strips)
(20) Receiving station of the production line
(21) Stacking station A
(22) Stacking station B
(23) Transfer station of the return line 17
(24) Loading and unloading device
(25) Store as a storage station
(26) Loading and unloading device
(27) Guide track for the device 26
(28) Guide track for the device 24

What is claimed is:

1. A method for fully automatically selecting and packing photovoltaic solar modules which were produced in large batches, the method comprising:
   (a) delivering solar modules of different quality on a production line from ongoing production,
   (b) passing the delivered solar modules through a quality testing device having devices for mechanical final tests and electrical final tests as well as a device for allocating an electronic identifier according to the quality level determined, and conveying the solar modules onward for packing only when the corresponding tests have been successfully passed and otherwise conveying to a stacking station for reject modules, (c) assigning the solar modules to corresponding customers according to the quality level determined and providing them with module carriers desired by the respective customer, (d) picking up the solar modules by a lifting sucker and conveying, via running rails, to corresponding removal stations according to their quality class or their customer and stacking them on top of one another in said stations, (e) automatically laying strips, as spacers, onto each stacked solar module until the desired delivery is complete, wherein the strips are dispensed by a strip magazine between the stacked modules, the strips in the strip magazine are of a plurality of different thicknesses and lengths, (f) wrapping a complete delivery by a film winder and providing the delivery with a protective cap on two sides or all four sides by a protective cap applicator and combining the delivery with strip-like packaging material in a region of the protective caps under stress by a strapping device.

2. The method as claimed in claim 1, wherein a return line via angle conveyors for transporting solar modules onto the production line is provided, this path being open to solar modules which have passed through the quality testing device with an entirely or partially negative result which warrants repair.

3. The method as claimed in claim 1, wherein the mechanical final test comprises optical investigations, vibration tests and investigations with ultrasound and the electrical final test comprises the effects of cold at certain points and subsequent measurements of impedances.

4. The method as claimed in claim 1, wherein the module carriers comprise different materials and different fastening methods are used when fastening said carrier to the module.

5. The method as claimed in claim 1, wherein the modules are distributed and stacked using a lifting sucker mount on the running rails, the lifting sucker being able to move solar modules horizontally and vertically, the running rail being able to be lengthened as desired and a height of the running rail supports being able to be adjusted in a controlled manner.

6. The method as claimed in claim 1, wherein the device for assembling packages wraps the stacked solar modules in film and welds them and/or provides the stacked solar modules with caps which are made of packaging material and can be plugged on, the package produced in this manner being connected to strip-like packaging material with a particular, adjustable tensile force in the strapping device.

7. The method as claimed in claim 1, wherein the module carriers comprise different materials and a plurality of fastening configurations for fastening the carrier to the module.

8. The method as claimed in claim 1, wherein each of the devices for assembling packages comprise a film winder, a protective cap applicator and a strapping device.

9. The method according to claim 1, wherein a device operable to detect cold solder joints comprises a cooling spray applicator operable to spray cooling spray on electrical transition points of electrical circuits to determine the cold solder joints.

10. The method according to claim 1, wherein the strips include a plurality of different types of strips, each of the different types of strips corresponds to a thickness of components projecting from a surface of each module such that the components projecting from the surface of a first stacked module do not damage a second adjacent stacked module.

11. The method according to claim 1, wherein selection criteria is determined via a bar code.

12. The method according to claim 1, wherein the strips dispensed between the stacked modules are formed of different material having different degrees of hardness.

13. A non-transitory computer readable storage medium having program code of a computer program for carrying out a method comprising:

(a) delivering solar modules of different quality on a production line from ongoing production, (b) passing the delivered solar modules through a quality testing device having devices for mechanical final tests and electrical final tests as well as a device for allocating an electronic identifier according to a quality level determined, and conveying the solar modules onward for packing only when the corresponding tests have been successfully passed and otherwise conveying to a stacking station for reject modules, (c) assigning the solar modules to corresponding customers according to the quality level determined and provided them with module carriers desired by the respective customer or else are left without a module carrier, (d) picking up the solar modules which are thus finished by a lifting sucker and conveying, via running rails, to corresponding removal stations according to their quality class or their customer and stacking them on top of one another in said stations, (e) automatically laying strips as spacers, onto each stored solar module until the desired delivery is complete, wherein the strips are dispensed by a strip magazine between the stacked modules, the strips in the strip magazine are of a plurality of different thicknesses and lengths, (f) wrapping a complete delivery by a film winder and providing the delivery a protective cap on two sides or all four sides by a protective cap applicator and combining the delivery with strip-like packaging material in the region of the protective caps under stress by a strapping device.

14. A method for fully automatically selecting and packing photovoltaic solar modules which were produced in large batches, the method comprising:

(a) delivering solar modules of different quality on a production line from ongoing production, (b) passing the delivered solar modules through a quality testing device having devices for mechanical final tests and electrical final tests as well as a device for allocating an electronic identifier according to the quality level determined, and conveying said modules onward for packing only when the corresponding tests have been successfully passed and otherwise conveying to a stacking station for reject modules, (c) assigning the solar modules to corresponding customers according to the quality level determined and providing them with module carriers desired by the respective customer or else are left without a module carrier, (d) picking up the solar modules which are thus finished by devices, conveying to corresponding removal stations according to their quality class or their customer and stacking them on top of one another in said stations, (e) automatically laying strips, as spacers, onto each stacked solar module until the desired delivery is complete, wherein the strips are dispensed by a strip magazine between the stacked modules, the strips in the strip magazine are of a plurality of different thicknesses and lengths, (f) wrapping a complete delivery by a film winder, providing the delivery a protective cap on two sides or all four sides by a protective cap applicator and combining the delivery with strip-like packaging material in the region of the protective caps under stress by a strapping device.

15. The method as claimed in claim 14, wherein the modules are distributed and stacked using a lifting sucker mount on a running rail, the lifting sucker being able to move solar modules horizontally and vertically, the running rail being able to be lengthened as desired and a height of the running rail supports being able to be adjusted in a controlled manner.

16. The method as claimed in claim 14, wherein the device for assembling packages wraps the stacked solar modules in film and welds them and/or provides the stacked solar modules with caps which are made of packaging material and can be plugged on, the package produced in this manner being connected to strip-like packaging material with a particular, adjustable tensile force in the strapping device.

17. The method as claimed in claim 14, wherein the module carriers comprise different materials and a plurality of fastening configurations for fastening the carrier to the module.

18. The method according to claim 14, wherein the strips dispensed between the stacked modules are formed of different material having different degrees of hardness.

* * * * *